United States Patent [19]
Anderson et al.

[11] Patent Number: 6,021,042
[45] Date of Patent: Feb. 1, 2000

[54] COOLING DUCT FOR A COMPUTER COOLING SYSTEM WITH REDUNDANT AIR MOVING UNITS

[75] Inventors: Paul H. Anderson; A. James Geddes, both of Beaverton, Oreg.; Thomas A. Boyd, BattleGround, Wash.

[73] Assignee: Intel Corporation, Santa Clara, Calif.

[21] Appl. No.: 08/907,296

[22] Filed: Aug. 6, 1997

[51] Int. Cl.[7] .................................................. H05K 7/20
[52] U.S. Cl. ..................... 361/695; 165/80.3; 165/127; 454/184
[58] Field of Search .............................. 165/80.3, 104.34, 165/122–127; 361/687, 690, 694, 695, 697, 717–719; 454/184; 174/16.1; 236/49.4; 415/66; 416/120–128; 29/890.035, 890.03

[56] References Cited

U.S. PATENT DOCUMENTS

| | | |
|---|---|---|
| 5,107,398 | 4/1992 | Bailey . |
| 5,438,226 | 8/1995 | Kuchta . |
| 5,546,272 | 8/1996 | Moss et al. . |
| 5,559,673 | 9/1996 | Gagnon . |
| 5,572,403 | 11/1996 | Mills . |
| 5,598,320 | 1/1997 | Toedtman et al. . |
| 5,745,041 | 4/1998 | Moss . |
| 5,751,549 | 5/1998 | Eberhardt . |
| 5,793,608 | 8/1998 | Winick . |
| 5,793,610 | 8/1998 | Schmitt . |
| 5,813,243 | 9/1998 | Johnson . |

*Primary Examiner*—Gerald Tolin
*Attorney, Agent, or Firm*—Blakely, Sokoloff, Taylor & Zafman LLP

[57] ABSTRACT

A cooling duct for a computer system with redundant air moving units includes a first inlet that receives a first air flow from a first air moving unit. The cooling duct also includes a second inlet that receives a second air flow from a second air moving unit. A mixing chamber is connected to the first inlet and the second inlet. The mixing chamber receives and mixes the first air flow and the second air flow. A first outlet is connected to the mixing chamber. The first outlet directs the first air flow and the second air flow to a first location. A second outlet is connected to the mixing chamber. The second outlet directs the first air flow and the second air flow to a second location.

19 Claims, 10 Drawing Sheets

COOLING DUCT FOR A COMPUTER COOLING SYSTEM WITH REDUNDANT AIR MOVING UNITS

FIELD OF THE INVENTION

The present invention relates to cooling systems in computer systems. More specifically, the present invention relates to cooling ducts that direct air flow from a plurality of air moving units in a computer system.

BACKGROUND OF THE INVENTION

The current generation of central processing units (CPUs) generate a significant amount of heat during operation. If the heat generated by the processors are not properly dissipated, then the heat builds up and raises the temperature of the processors beyond their recommended operating temperature. This adversely affects the performance of the processors. Various devices have been implemented to keep processors at their recommended operating temperature by transferring or dissipating heat generated by the processors away from the processors and nearby circuitry.

Dedicated cooling fans and air blowers provided an efficient means to dissipate the heat generated by the processors. While the primary function of the dedicated fan or air blower is to force-cool the processor, the fan or air blower may also act as an air exchanger for the computer system. Force-cooling involves cooling a specific component by directly applying air across the surface of the component. High velocity air applied to the surface of the component raises the convective heat transfer coefficient of the surface of that component, thereby increasing convection cooling with respect to that component. Air exchange cooling involves replacing heated air in a first location, such as inside a chassis of the computer system, with cooler air from a second location, such as outside the chassis. Although fans and air blowers provide an effective means for cooling a processor in the computer system, the fan and air blower system becomes ineffective when the fan or air blower breaks down.

Cooling systems in the past implementing redundant fans or blowers had difficulties positioning the redundant fan or blower at an equally optimal position with the primary fan or blower when the redundant fan or blower was operating in conjunction with the primary fan as well as alone. This was particularly a problem for multiple processor systems requiring a plurality of locations in the computer system to cooled.

SUMMARY

An apparatus according to a first embodiment of the present invention is disclosed. The apparatus includes a first inlet that receives a first air flow from a first air moving unit. The apparatus also includes a second inlet that receives a second air flow from a second air moving unit. A mixing chamber is connected to the first inlet and the second inlet. The mixing chamber receives and mixes the first air flow and the second air flow. A first outlet is connected to the mixing chamber. The first outlet directs the first air flow and the second air flow to a first location. A second outlet is connected to the mixing chamber. The second outlet directs the first air flow and the second air flow to a second location.

An apparatus according to a second embodiment of the present invention is disclosed. The apparatus includes a first inlet that receives a first air flow from a first air moving unit. The apparatus also includes a second inlet that receives a second air flow from a second air moving unit. A mixing chamber is connected to the first inlet and the second inlet. The mixing chamber receives and mixes the first air flow and the second air flow. A first outlet duct is coupled to the mixing chamber. The first outlet duct directs the first air flow and the second air flow to a first outlet. A second outlet duct is coupled to the mixing chamber. The second outlet duct directs the first air flow and the second air flow to a second outlet.

According to a third embodiment of the present invention, an apparatus for directing a first air flow from a first air moving unit and a second air flow from a second air moving unit to a first and second location in a computer system chassis is disclosed. The apparatus includes an air moving chamber defined by a ceiling wall, a bottom wall, a back wall, a first side wall, and a removable side. The air moving unit chamber houses the first and second air moving unit. A mixing chamber is connected to the air moving chamber and defined by the ceiling wall, the bottom wall, the back wall, the second side wall, and the removable side. The mixing chamber receives the first air flow and the second air flow. A first outlet is on the back wall of the mixing chamber. The first outlet directs the first air flow and the second air flow to the first location. A second outlet is on the back wall of the mixing chamber. The second outlet directs the first air flow and the second air flow to the second location.

According to a fourth embodiment of the present invention, a method for cooling a first location and a second location in a computer system is disclosed. Direct a first air flow from a first air moving unit into a mixing chamber. Direct a second air flow from a second air moving unit into the mixing chamber. Direct the first and second air flow in the mixing chamber to the first location in the computer system and the second location in the computer system.

BRIEF DESCRIPTION OF THE DRAWINGS

The present invention is illustrated by way of example and not by way of limitation in the figures of the accompanying drawings in which like references indicate similar elements and in which.

DETAILED DESCRIPTION

Figure 1:
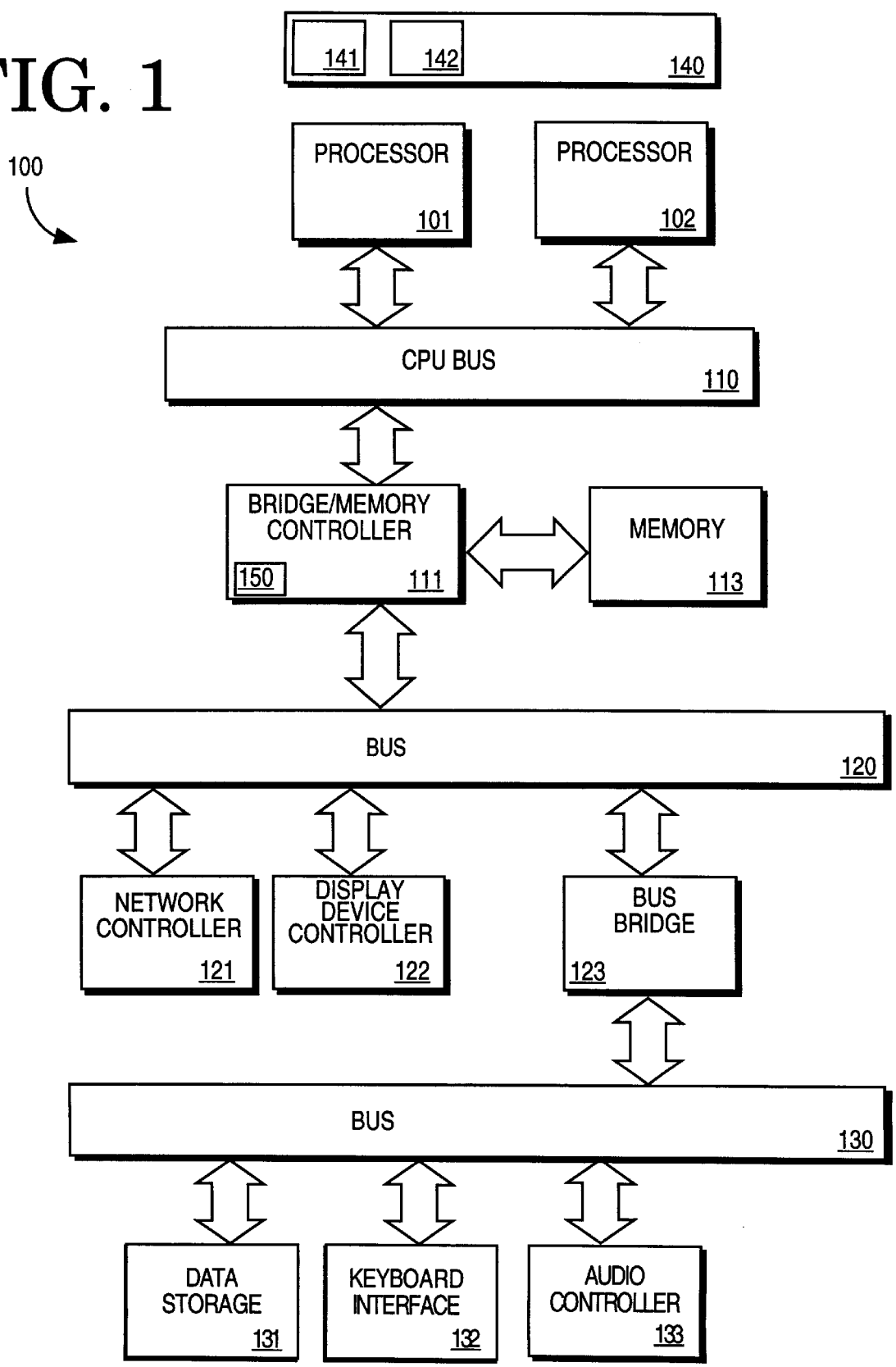
FIG. 1 illustrates a block diagram of an embodiment of a computer system implementing the present invention according to an embodiment of the present invention.

Referring to FIG. 1, a computer system upon which an embodiment of the present invention may be implemented is shown as 100. The computer system 100 includes a first processor 101 and a second processor 102 that processes digital data signals. The first processor 101 and the second processor 102 may be complex instruction set computer (CISC) processors, reduced instruction set computing (RISC) processors, very long instruction work (VLIW) processor, processors implementing a combination of instruction sets, or other processor devices. FIG. 1 shows an example of the present invention implemented on a dual processor computer system 100. However, it is understood that the present invention may be implemented in a computer system having a single processor or a plurality of processors. The first processor 101 and the second processor 102 are coupled to a CPU bus 110 which transmits signals between the first processor 101 and the second processor 102 and other components in the computer system 100.

Cooling duct unit 140 is closely proximated and thermally coupled with respect to the first processor 101 and the second processor 102. According to one embodiment of the present invention, cooling duct unit 140 houses a first air moving unit 141 and a second air moving unit 142. The cooling duct unit 140 operates to channel a first air flow from the first air moving unit 141 and a second air flow from the second air moving unit 142 into a mixing chamber in the cooling duct unit 140 where the first and second air flows are mixed. The combined first air flow and the second air flow are then directed towards the first processor 101 and the second processor 102 to dissipate heat generated by the first processor 101 and the second processor 102. According to an alternate embodiment of the cooling duct unit 140, the first air moving unit 141 and the second air moving unit 142 are externally coupled to the cooling duct unit 140.

As an example, memory 113 may be a dynamic random access memory (DRAM) device, a static random access memory (SRAM) device, or other memory device. The memory 113 stores information or other intermediate data signals that may be executed by the processor 101. A bridge memory controller 111 is coupled to the CPU bus 110 and the memory 113. The bridge memory controller 111 directs data between the first processor 101 and the second processor 102, the memory 113, and other components in the computer system 100 and bridges signals from these components to a high speed input/output (I/O) bus 120.

The high speed I/O bus 120 supports peripherals operating at high data throughput rates. The high speed 10 bus 120 may comprise a single bus or a combination of multiple buses. As an example, the high speed I/O bus 120 may comprise a Peripheral Components Interconnect (PCI) bus, a Personal Computer Memory Card International Association (PCMCIA) bus or other buses. The high speed I/O bus 120 provides communication links between components in the computer system 100. A network controller 121 links a network of computers together and provides communication among the machines. A display device controller 122 is coupled to the high speed I/O bus 120. The display device controller 122 allows coupling of a display device (not shown) to the computer system 100 and acts as an interface between the display device and the computer system 100. The display device controller may comprise a monochrome display adapter (MDA) card, a color graphics adapter (CGA) card, an enhanced graphics adapter (EGA) card, an extended graphics array (XGA) card or other display device controller. The display device may comprise a television set, a computer monitor, a flat panel display or other display device. The display device receives data signals from the first processor 101 and the second processor 102 through the display device controller 122 and displays the data signals to the user of the computer system 100.

An I/O bus 130 is used for communicating information between peripheral devices that operate at lower throughput rates. The I/O bus 130 may comprise a single bus or a combination of multiple buses. As an example, the I/O bus 130 may comprise an Industry Standard Architecture (ISA) bus, an Extended Industry Standard Architecture (EISA) bus or a Micro Channel Architecture (MCA) bus. The I/O bus 130 provides communication links between components in the computer system 100. A keyboard interface 132 may comprise a keyboard controller or other keyboard interface. The keyboard interface 132 may comprise a dedicated device or can reside in another device such as a bus controller or other controller. The keyboard interface 132 allows coupling of a keyboard (not shown) to the computer system 100 and transmits signals from a keyboard to the computer system 100. A data storage device 131 may comprise a hard disk drive, a floppy disk drive, a CD-ROM device, a flash memory device or other mass storage device. An audio controller 133 operating to coordinate the recording and playing of sounds is also coupled to the I/O bus 130. A bus bridge 123 couples the high speed I/O bus 120 to the I/O bus 130. The bus bridge 123 comprises a translator to bridge signals between the high speed I/O bus 120 and the I/O bus 130.

Figure 2:
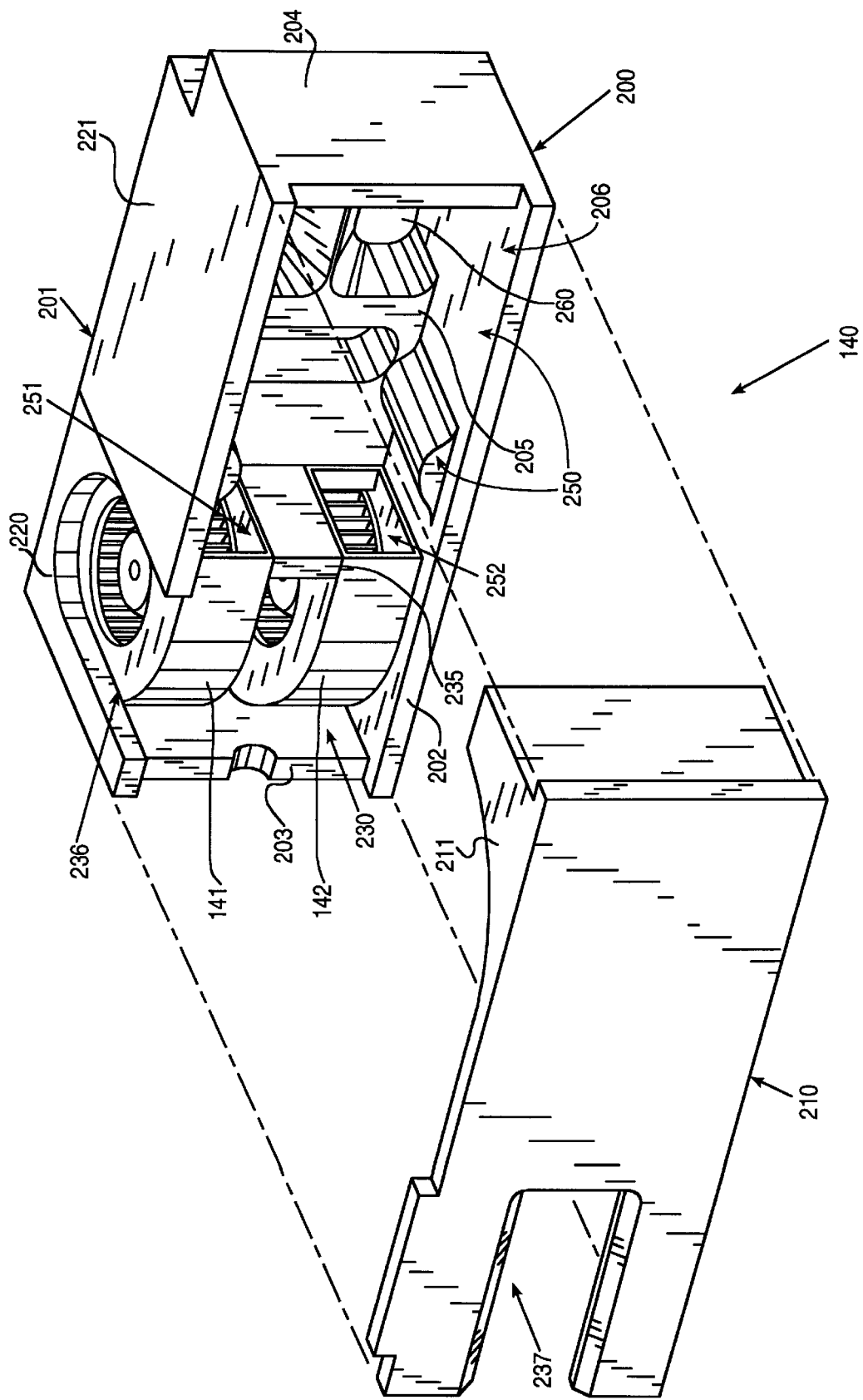
FIG. 2 illustrates a perspective view of the cooling duct unit according to an embodiment of the present invention.

FIG. 2 illustrates a perspective view of the cooling duct unit 140 according to an embodiment of the present invention. The cooling duct unit 140 includes a central piece 200 and a removable side 210. The central piece 200 includes a ceiling wall 201 having a first section 220 and a second section 221. The central piece 200 also includes a bottom wall 202, a first side wall 203, a second side wall 204, a back wall 205, and an open side 206 opposite and parallel to the back wall 205. The removable side 210 is insertable into the central piece 200 through the open side 206 to provide partial covering of the open side 206 of the central unit 200.

The cooling duct unit 140 includes an air moving unit chamber 230. The air moving unit chamber 230 is defined by the first side wall 203, the ceiling wall 201, the bottom wall 202, the back side 205, a support structure 235, and the removable side 210. The air moving unit chamber 230 operates to house a first air moving unit 141 and a second air moving unit 142. The first section of the ceiling wall 201 includes a first air inlet 236 to allow a first air moving unit 141 to access air outside the cooling duct unit 140. The removable side 210 includes a second air inlet 237 to allow a second air moving unit 142 to access air outside the cooling duct unit 140. The first and second air moving units 141 and 142 operate to move air inside the cooling duct unit 140 from outside the cooling duct unit 140. A support structure 235, attached to the back wall 205, operates to hold the first air moving unit 141 firmly against the ceiling wall 201. The support structure 235 also operates to hold the second air moving unit 142 firmly against the bottom wall 202. The support structure 235 allows the first and second air moving units 141 and 142 to be easily mounted in the air moving unit chamber 230 without the use of snaps or screws. The support structure 235 simplifies the removal and installation process of an air moving unit.

The cooling duct unit 140 also includes a mixing chamber 250. The mixing chamber 250 is defined by the ceiling wall 201, the bottom wall 202, the back wall 205, the second side wall 204, the support structure 235, and the removable side 210. The mixing chamber 250 is connected to the air moving unit chamber 230 by a first inlet 251 and a second inlet 252. The first inlet 251 is defined by the second section of the ceiling wall 221, the support structure 235, the back wall 205, and the removable side 210. The second inlet 252 is defined by the bottom wall 202, the support structure 235, the back wall 205, and the removable side 210. The first inlet 251 operates to receive a first air flow into the mixing chamber 250 from the first air moving unit 141. The second inlet 252 operates to receive a second air flow into the mixing chamber 250 from the second air moving unit 142. The mixing chamber 250 operates to mix the first air flow and the second air flow.

The mixing chamber 250 is connected to a first outlet (not shown in FIG. 2) and a second outlet 260. The first outlet and the second outlet 260 reside on the back wall 205 of the central piece 200. The first outlet directs the first air flow and the second air flow in the mixing chamber 250 to a first location. The second outlet 260 directs the first air flow and the second air flow in the mixing chamber 250 to a second location. According to an embodiment of the present invention, the first location is an area in chassis of the computer system 100 (shown in FIG. 1) where the first processor 101 (shown in FIG. 1) resides and the second location is an area where the second processor 102 (shown in FIG. 1) resides.

The removable side 210 includes a fastener element 211. The fastener element 211 slides inside the mixing chamber 250 when the removable side 210 is inserted over the open side 206 of the central piece 200. The fastener element 211 operates to hold the removable side 211 inside the center piece 200 and prevent the removable side 211 from coming off. The fastener element 211 also helps direct the first air flow and second air flow to the first outlet and the second outlet 260.

Figure 3A:
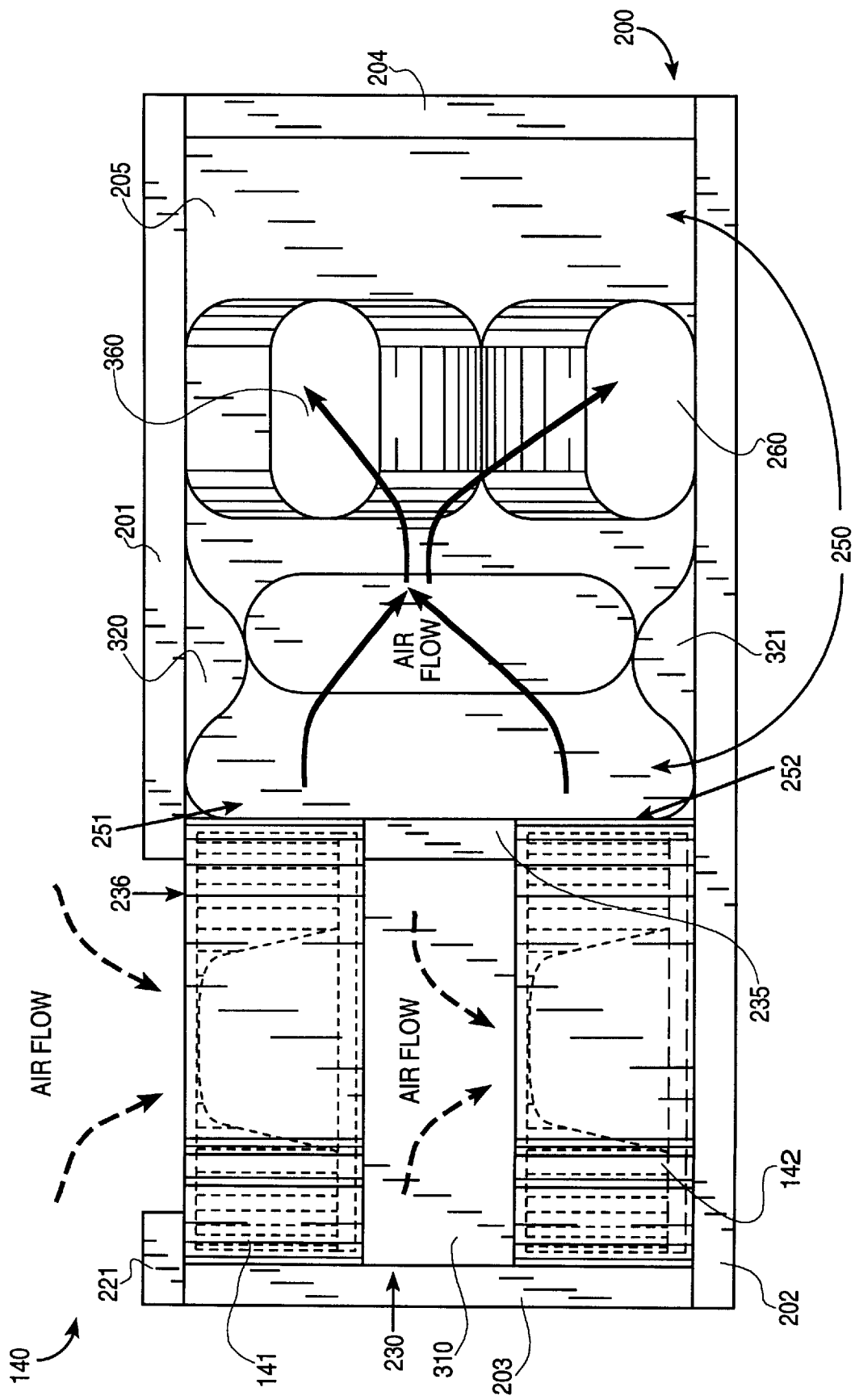
FIG. 3A illustrates a front view of the cooling duct unit showing the air flow when both air moving units are operational according to an embodiment of the present invention.

FIG. 3A illustrates a front view of the cooling duct unit 140 without the removable side 210. FIG. 3A illustrates the air movement inside the cooling duct unit 140 as if the removable side 210 was inserted inside the central piece 200. The first air moving unit 141 accesses air from outside the cooling duct unit 140 from the first air inlet 236. The first air moving unit 141 pulls the outside air inside the air moving unit chamber 230 and pushes the outside air via a first air flow through the first inlet 251 into the mixing chamber 250. The second air moving unit 142 accesses air from outside the cooling duct unit 140 from the second air inlet 237 shown in FIG. 2. The air flows entering into the first and second air moving units 141 and 142 are indicated by dotted arrows. The air flows being pushed out of the first and second air moving units 141 and 142 are indicated by solid arrows. The outside air enters an air space 310 in the air moving unit chamber 230 located between the first and second air moving units 141 and 142. The second air moving unit 142 pulls the outside air inside the air moving unit chamber 230 and pushes the outside air via a second air flow through the second inlet 252 into the mixing chamber 250. It should be appreciated that the first air moving unit 141 and the second air moving unit 142 can be an air blower, a fan, or any other air moving device.

A first air director 320, connected to the ceiling wall 201, directs the first air flow from the first air moving unit 141 downwards in the mixing chamber 250 so that the first air flow mixes with the second air flow from the second air moving unit 142. A second air director 321, connected to the bottom wall 202, directs the second air flow from the second air moving unit 142 upwards in the mixing chamber 250 so that the second air flow mixes with the first air flow from the first air moving unit 141. A first outlet 360 on the back wall 205 of the center piece 200 directs the first and second air flow from the mixing chamber 250 to a first location outside the cooling duct unit 140. The second outlet 260 on the back wall 205 of the center piece 200 directs the first and second air flow from the mixing chamber 250 to a second location outside the cooling duct unit 140.

Figure 3B:
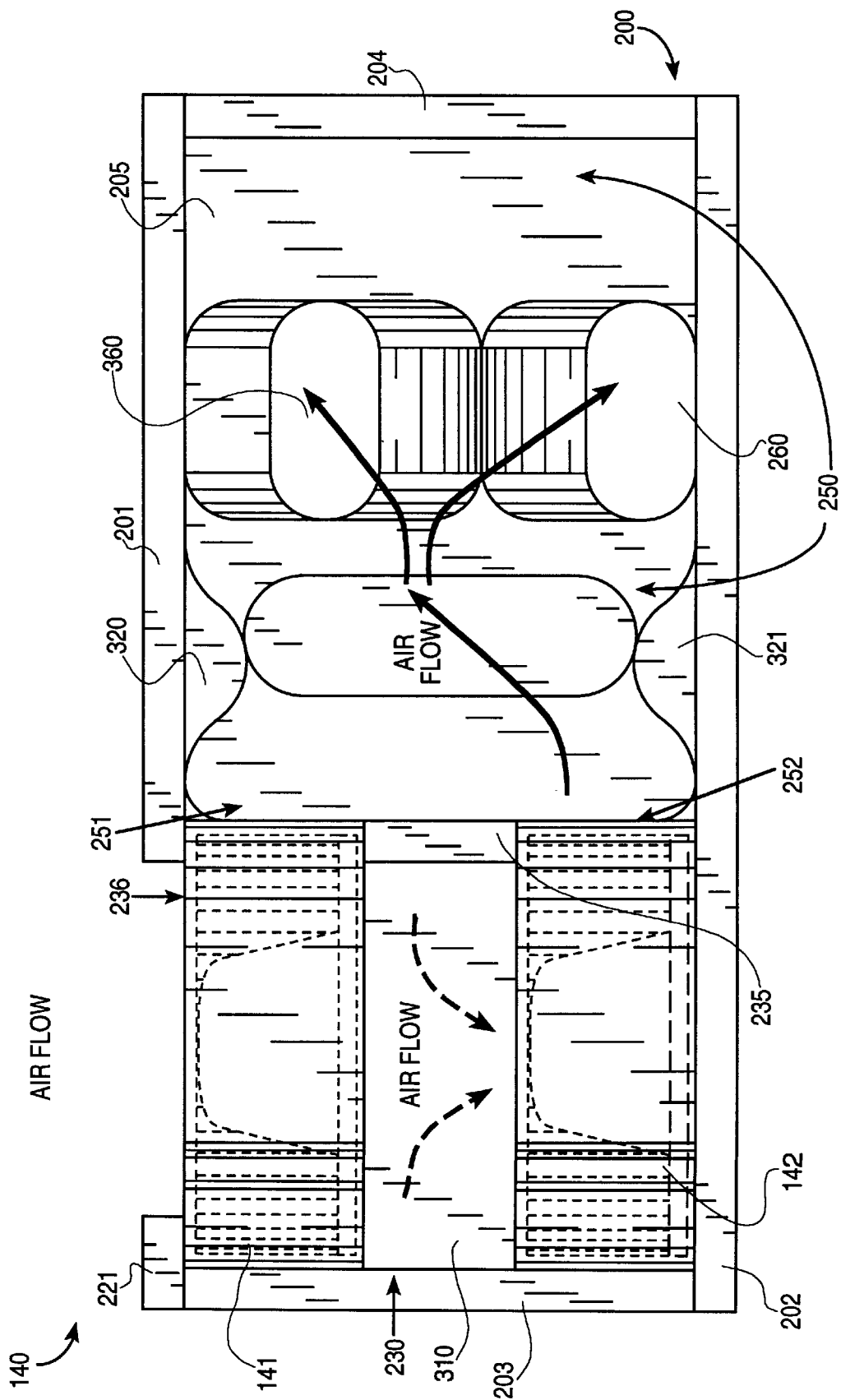
FIG. 3B illustrates a front view of the cooling duct unit showing the air flow when the first air moving unit is inoperable according to an embodiment of the present invention.
Figure 3C:
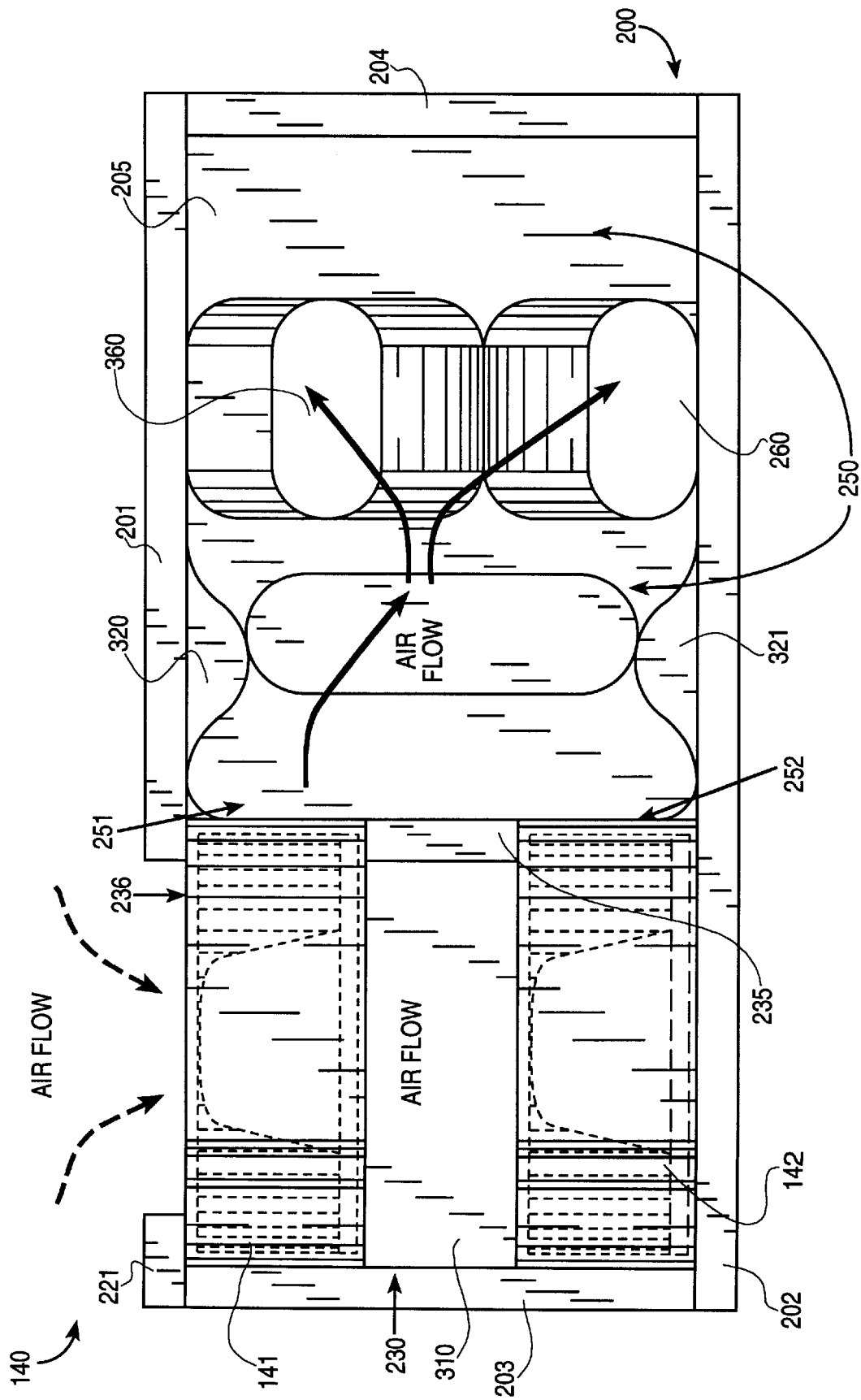
FIG. 3C illustrates a front view of the cooling duct unit showing the air flow when the second air moving unit is inoperable according to an embodiment of the present invention.

The cooling duct unit 140 places the first and second air moving units 141 and 142 in a position to cool a first and second location in the computer system 100 (shown in FIG. 1). The cooling duct unit 140 mixes the first air flow from the first air moving unit 141 and the second air flow from the second air moving unit 142 and directs the combined first and second air flow to the first and second location in the computer system when both the first and the second air moving units 141 and 142 are operable. The first and second air moving units 141 and 142 are also positioned in the cooling duct unit 140 such that when one of the first and second air moving unit 141 and 142 fails, the operable air moving unit is situated to generate air flow that effectively cools both the first and second location in the computer system. FIG. 3B illustrates a front view of the cooling duct unit 140 showing the air flow when the first air moving unit 141 is inoperable according to an embodiment of the present invention. The air flow generated from the second air moving unit 142 is directed into the mixing chamber 250 and out through the first outlet 360 and the second outlet 260. According to an embodiment of the present invention, the second air director 321 facilitates directing the air flow generated from the second air moving unit 142 out through the first outlet 360 and the second outlet 260. FIG. 3C illustrates a front view of the cooling duct unit 140 showing the air flow when the second air moving unit 142 is inoperable according to an embodiment of the present invention. The air flow generated from the first air moving unit 141 is directed into the mixing chamber 250 and out through the first outlet 360 and the second outlet 260. According to an embodiment of the present invention, the first air director 320 facilitates directing the air flow generated from the first air moving unit 141 out through the first outlet 360 and the second outlet 260.

Figure 4:
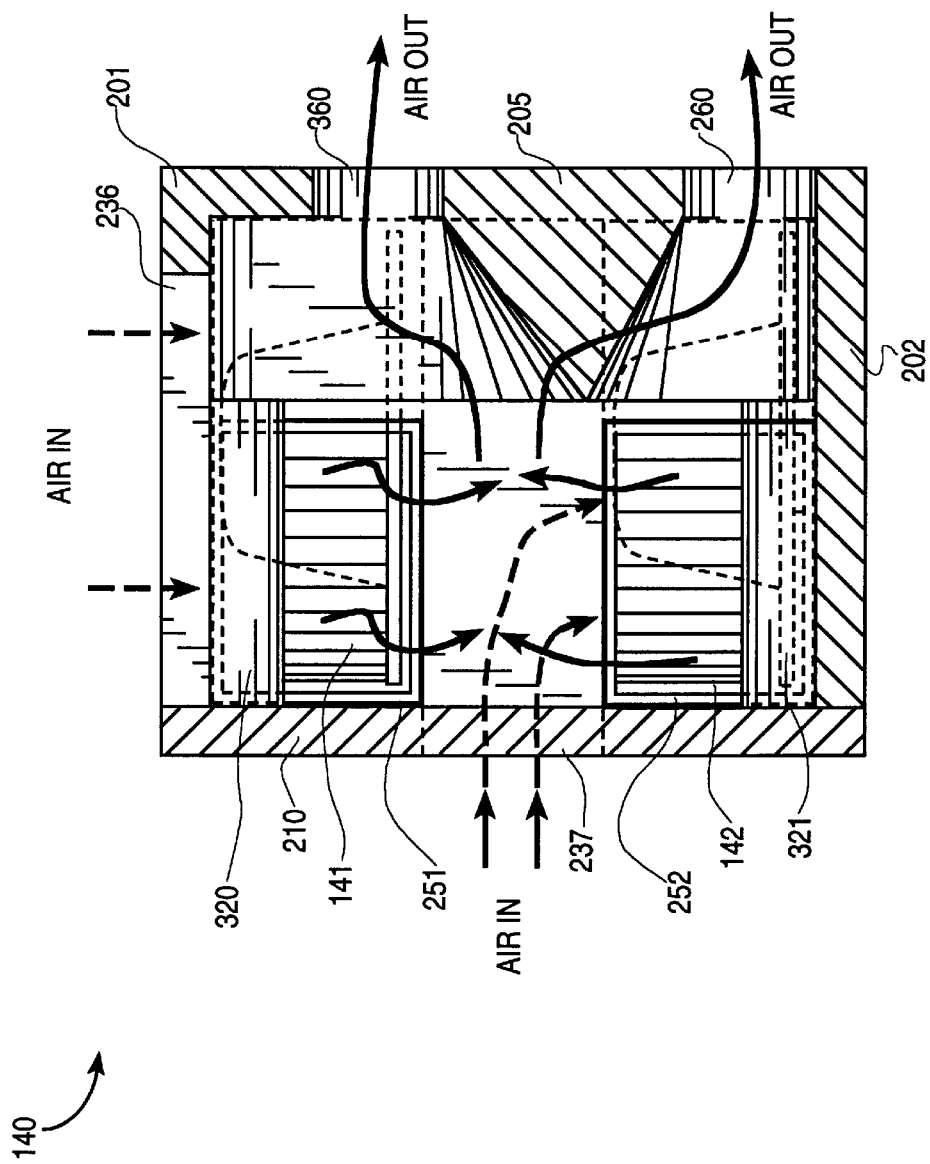
FIG. 4 illustrates a side view of the cooling duct unit according to an embodiment of the present invention.

FIG. 4 illustrates a side view of the cooling duct unit. FIG. 4 illustrates the removable side 210 inserted inside the center piece 200 and the second side 204 (shown in FIG. 3) cut away. Air from outside the cooling duct unit 140 enters the cooling duct unit 140 from the first air inlet 236 on the ceiling wall 201 and the second air inlet 237 on the removable side 210. The first air flow from the first air moving unit 141 is pushed through the first inlet 251 and the second air flow from the second air moving unit 142 is pushed through the second inlet 252. The first air director 320 directs the first air flow from the first air moving unit 141 downwards so that the first air flow mixes with the second air flow from the second air moving unit 142. The second air director 321, directs the second air flow from the second air moving unit 142 upwards so that the second air flow mixes with the first air flow from the first air moving unit 141. The first outlet 360 on the back wall 205 directs the first and second air flow to a first location outside the cooling duct unit 140. The second outlet 260 on the back wall 205 directs the first and second air flow to a second location outside the cooling duct unit 140.

Figure 5:
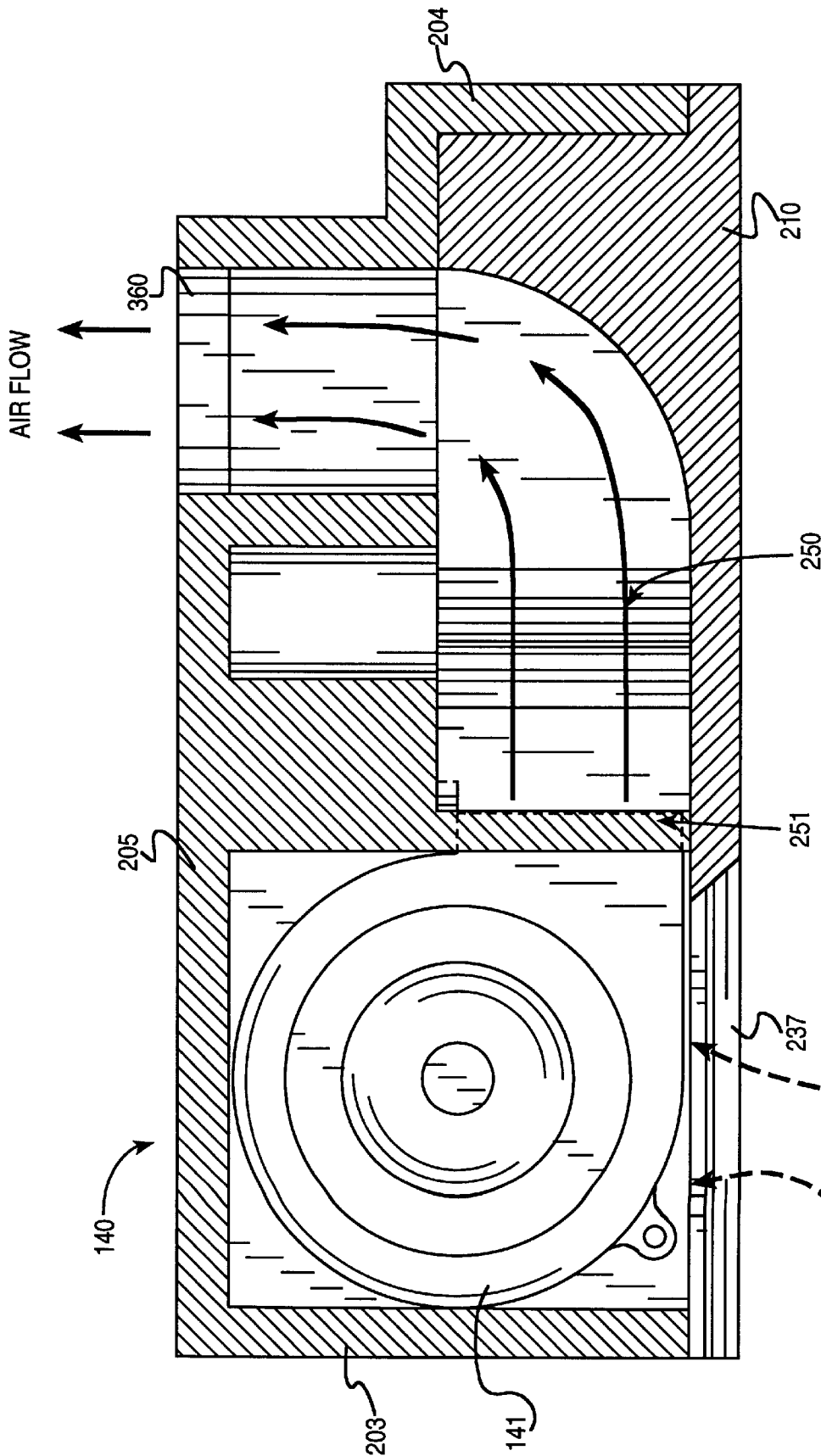
FIG. 5 illustrates a top view of the cooling duct unit according to an embodiment of the present invention.

FIG. 5 illustrates a top view of the cooling duct unit. FIG. 5 illustrates the cooling duct unit 140 with the ceiling wall 201 (shown in FIG. 4) cut away. Air moving unit 141 generates a first air flow that is pushed through the first inlet 251 into the mixing chamber 250. The first air flow is mixed with a second air flow in the mixing chamber 250 before being directed to the first outlet 360 on the back wall 205.

In an alternate embodiment of the cooling duct unit 140 shown in FIGS. 1–5, a first inlet trap door is connected to the first inlet 251. According to one embodiment of the first inlet trap door, the first inlet trap door is connected to the ceiling wall 201. According to a second embodiment of the inlet trap door, the first inlet trap door is connected to the first air moving unit 141. The first inlet trap door swings into the mixing chamber 250 and allows the first air flow from the first air moving unit 141 to pass into the mixing chamber 250 when the first air moving unit 141 is operable. The first inlet trap door covers the first inlet 251 and prevents the second air flow from the second air moving unit 142 from exiting the mixing chamber 250 through the first inlet 251 when the first air moving unit 141 is inoperable. A second inlet trap door is connected to the second inlet 252. According to one embodiment of the second inlet trap door, the second inlet trap door is connected to the support element 235. According to a second embodiment of the second inlet trap door, the second inlet trap door is connected to the second air moving unit 142. The second inlet trap door swings into the mixing chamber 250 and allows the second air flow from the second air moving unit 142 to pass into the mixing chamber 250 when the second air moving unit 142 is operable. The second inlet trap door covers the second inlet 252 and prevents the first air flow from the first air moving unit 141 from exiting the mixing chamber 250 through the second inlet 252 when the second air moving unit 142 is inoperable.

It should be appreciated that although only two air moving units 141 and 142 are described in the exemplary cooling duct unit 140 shown in FIGS. 1–5, the air moving unit chamber 230 of the cooling duct unit 140 may be configured to house any number of air moving units. It should also be appreciated that although only two outlets 360 and 260 are described in the exemplary cooling duct unit 140 shown in FIGS. 2–4, the mixing chamber 250 of the cooling duct unit 140 may be configured to have any number of outlets so that the air flow or air flows in the mixing chamber 250 may be directed towards any number of locations in the computer system 100 (shown in FIG. 1).

Figure 6:
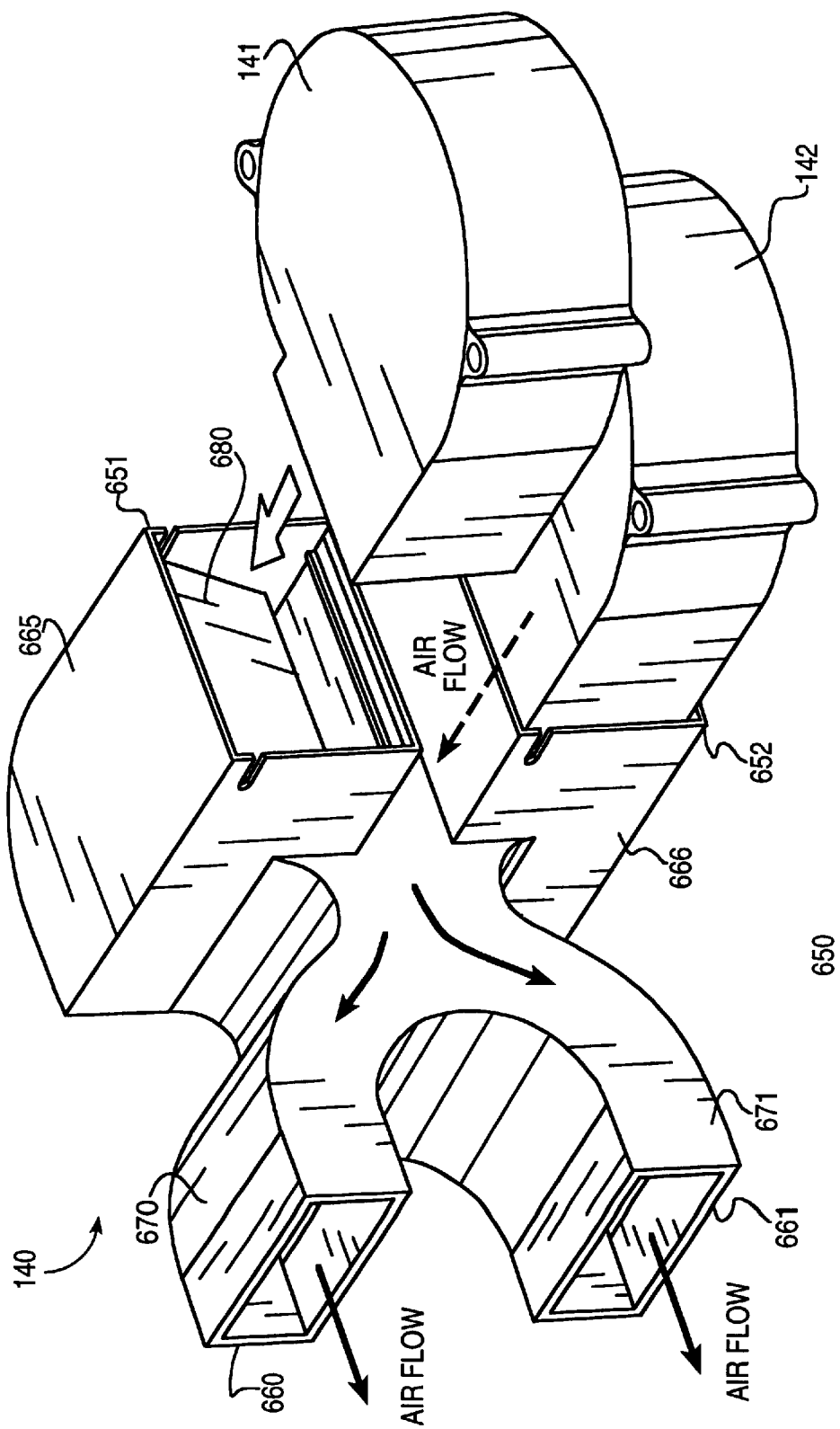
FIG. 6 illustrates a perspective view of the cooling duct unit according to an alternate embodiment of the present invention.

FIG. 6 illustrates the cooling duct unit according to an alternate embodiment of the present invention. The cooling duct 140 includes a first inlet 651 that receives a first air flow from a first air moving unit 141. The cooling duct 140 also includes a second inlet 652 that receives a second air flow from a second air moving unit 142. A first inlet duct 665 is connected to the first inlet 651 that receives the first air flow. The first inlet duct 665 directs the first air flow into a mixing chamber 650. A second inlet duct 666 is connected to the second inlet 652 that receives the second air flow. The second inlet duct 666 directs the second air flow into the mixing chamber 650. The mixing chamber 650 is connected to the first inlet duct 665 and the second inlet duct 666. The mixing chamber 650 receives the first air flow and the second air flow and mixes the first air flow with the second air flow. The combined first and second air flow is directed to a first outlet duct 670 and a second outlet duct 671 connected to the mixing chamber 650. The first outlet duct 670 directs the combined first and second air flow through a first outlet 660. The second outlet duct 671 directs the combined first and second air flow through a second outlet 661.

Similar to the cooling duct unit 140 shown in FIGS. 2–5, the cooling duct unit 140 shown in FIG. 6 also places the first and second air moving units 141 and 142 in an optimal position for cooling a first and second location in the computer system 100 (shown in FIG. 1). The cooling duct unit 140 also mixes the first air flow from the first air moving unit 141 and the second air flow from the second air moving unit 142 and directs the combined first and second air flow to the first and second location in the computer system when both the first and the second air moving units 141 and 142 are operable. The first and second air moving units 141 and 142 are also positioned in the cooling duct unit 140 such that when one of the first and second air moving unit 141 and 142 fails, the operable air moving unit is situated to generate air flow that effectively cools both the first and second location in the computer system.

The cooling duct unit 140 also includes a first inlet trap door 680. According to a first embodiment of the first inlet trap door 680, the first inlet trap door 680 is connected to the first inlet duct 665. According to a second embodiment of the first inlet trap door 680, the first inlet trap door is connected to the first inlet 651. The first inlet trap door 680 swings towards the mixing chamber 650 and allows the first air flow from the first air moving unit 141 to pass into the mixing chamber 650 when the first air moving unit 141 is operable. The first inlet trap door 680 covers the first inlet 251 and prevents the second air flow from the second air moving unit 142 from exiting the mixing chamber 650 through the first inlet 651 when the first air moving unit 141 is inoperable. The cooling duct unit 140 also includes a second inlet trap door (not shown). According to a first embodiment of the second inlet trap door, the second inlet trap door is connected to the second inlet duct 666. According to a second embodiment of the second inlet trap door, the second inlet trap door is connected to the second inlet 652. The second inlet trap door swings towards the mixing chamber 650 and allows the second air flow from the second air moving unit 142 to pass into the mixing chamber 650 when the second air moving unit 142 is operable. The second inlet trap door covers the second inlet 652 and prevents the first air flow from the first air moving unit 141 from exiting the mixing chamber 650 through the second inlet 652 when the second air moving unit 142 is inoperable.

Figure 7:
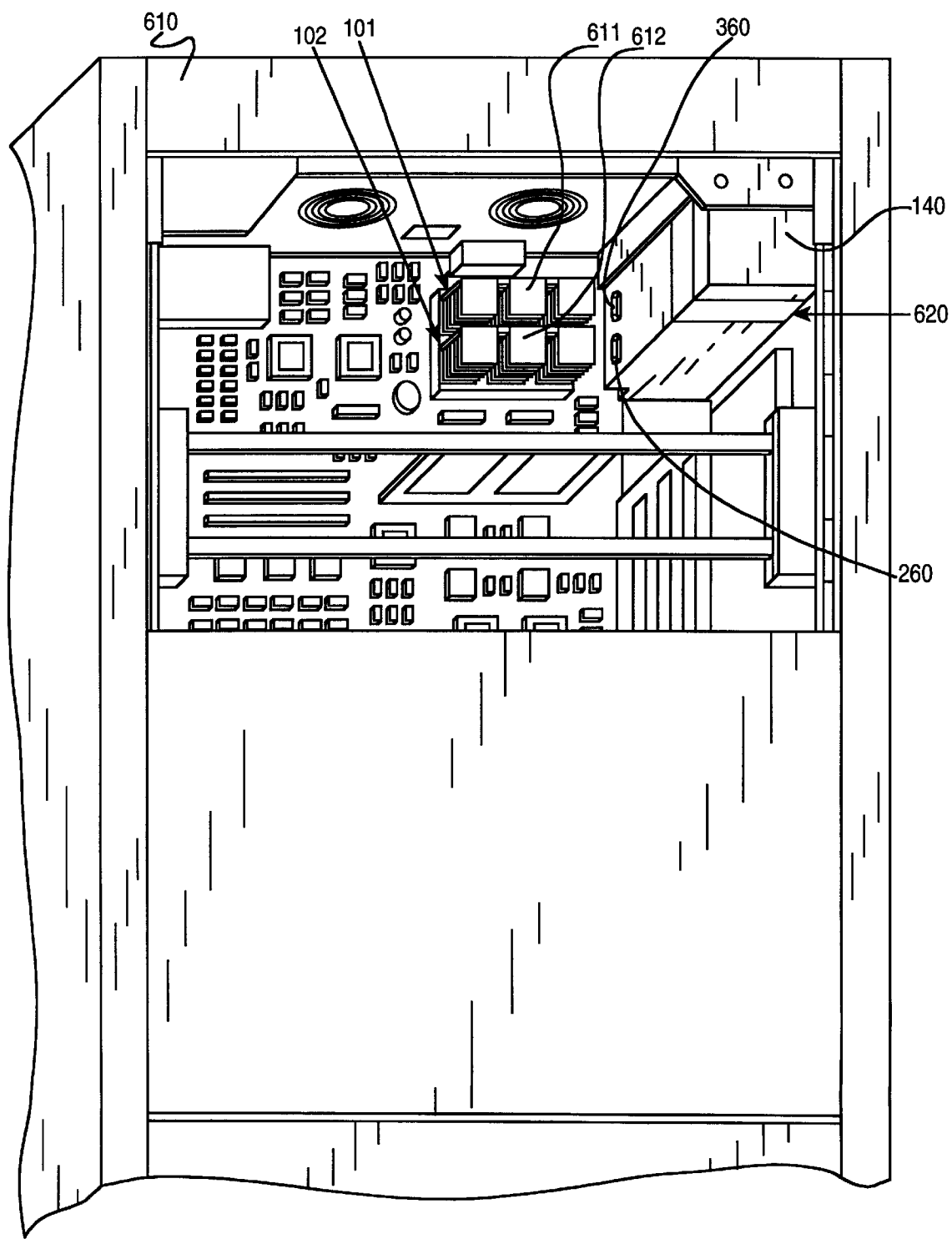
FIG. 7 illustrates the cooling duct unit installed inside a chassis of a computer system according to an embodiment of the present invention.

FIG. 7 illustrates an embodiment of the cooling duct unit inside a chassis of a computer system. The chassis 610 houses a first processor 101 and a second processor 102. A first plurality of heat sinks 611 operate to dissipate heat generated by the first processor 101. A second plurality of heat sinks 112 operate to dissipate heat generated by the second processor 102. Cooling duct unit 140 is also housed inside the chassis 610. The cooling duct unit 140 is secured in the chassis 610 by a band 620. A first and second air flow from the cooling duct unit 140 is directed towards the first and second processors 101 and 102 and the first and second set of heat sinks 611 and 612 by outlets 360 and 260 of the cooling duct unit 140.

Figure 8:
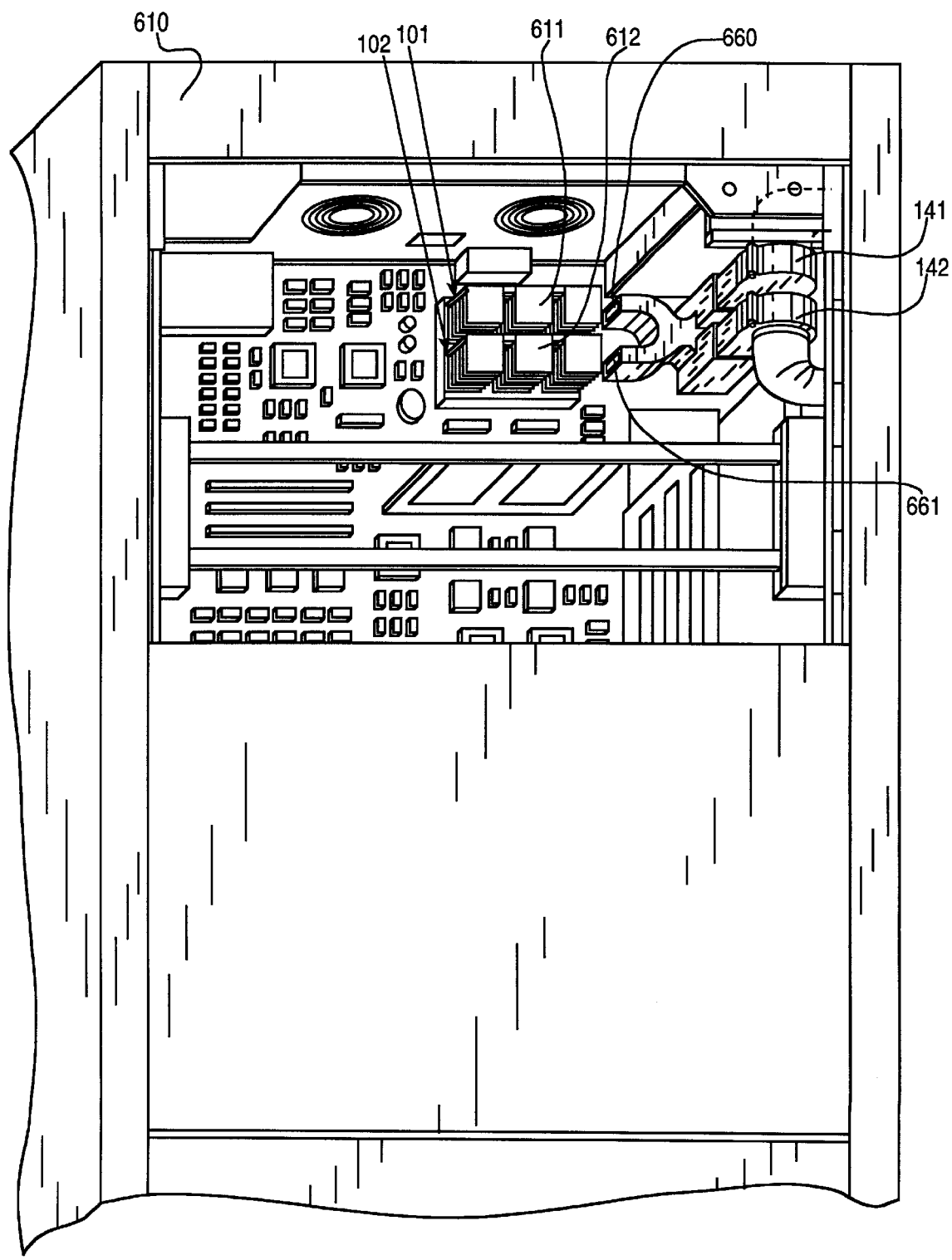
FIG. 8 illustrates an alternate embodiment of the cooling duct unit installed inside a chassis of a computer system.

FIG. 8 illustrates an embodiment of the cooling duct unit according to an alternate embodiment of the present invention inside a chassis of a computer system. A first and second air flow from the cooling duct 140 is directed towards the first and second processors 101 and 102 and the first and second set of heat sinks 611 and 612 by outlets 660 and 661 of the cooling duct unit 140.

In the foregoing specification, the invention has been described with reference to specific embodiments thereof. It will, however, be evident that various modifications and changes may be made thereto without departing from the broader spirit and scope of the invention. The specification and drawings are, accordingly, to be regarded in an illustrative rather than a restrictive sense.

What is claimed is:

1. A self-contained cooling apparatus to fit within a computer system chassis, comprising:
   a first inlet that receives a first air flow from a first air moving unit;
   a second inlet that receives a second air flow from a second air moving unit;
   a mixing chamber, connected to the first inlet and the second inlet, that receives and mixes the first air flow and the second air flow;
   a first outlet, coupled to the mixing chamber, that directs the mixed first and second air flows to cool a first device outside the mixing chamber and within the computer system chassis; and
   a second outlet, coupled to the mixing chamber, that directs the mixed first and second air flows to cool a second device outside the mixing chamber and within the computer system chassis.

2. The apparatus of claim 1, further comprising an air moving unit chamber, coupled to the first inlet and the second inlet, that houses the first air moving unit and the second air moving unit.

3. The apparatus of claim 1, further comprising a support element, connecting the first inlet and the second inlet, that supports the first moving unit and the second moving unit.

4. The apparatus of claim 2, further comprising:
   a first air inlet, connected to the air moving unit chamber, that receives outside air; and
   a second air inlet, connected to the air moving unit chamber, that receives outside air.

5. The apparatus of claim 1, further comprising:
   a first inlet trap-door, coupled to the first inlet, that swings into the mixing chamber allowing the first air flow from the first cooling unit to pass into the mixing chamber and preventing the second air flow from the second cooling unit from exiting the mixing chamber through the first inlet; and
   a second inlet trap-door, coupled to the second inlet, that swings into the mixing chamber allowing the second air flow from the second cooling unit to pass into the mixing chamber and preventing the first air flow from the first cooling unit from exiting the mixing chamber through the second inlet.

6. The apparatus of claim 1, further comprising:
   a first air director, inside the mixing chamber, that directs the first air flow towards the second air flow; and
   a second air director, inside the mixing chamber, that directs the second air flow towards the first air flow.

7. The apparatus of claim 1, further comprising:
   a first air director, inside the mixing chamber, that directs the first air flow to the first outlet and the second outlet when the second air moving unit is inoperable; and
   a second air director, inside the mixing chamber, that directs the second air flow to the first outlet and the second outlet when the first air moving unit is inoperable.

8. A self-contained cooling apparatus to fit within a computer system chassis, comprising:
   a first inlet that receives a first air flow from a first air moving unit;
   a second inlet that receives a second air flow from a second air moving unit;
   a mixing chamber that receives and mixes the first air flow and the second air flow; and
   a first outlet duct, coupled to the mixing chamber, that directs the mixed first and second air flows to a first outlet positioned proximate a first device outside the mixing chamber; and
   a second outlet duct, coupled to the mixing chamber, that directs the mixed first and second air flows to a second outlet positioned proximate a second device outside the mixing chamber.

9. The apparatus of claim 8, further comprising:
   a first inlet trap-door, coupled to the first inlet, that swings towards the mixing chamber allowing the first air flow from the first air moving unit to pass into the mixing chamber and preventing the second air flow from the second air moving unit from exiting the mixing chamber through the first inlet; and
   a second inlet trap-door, coupled to the second inlet, that swings towards the mixing chamber allowing the second air flow from the second air moving unit to pass into the mixing chamber and preventing the first air flow from the first air moving unit from exiting the mixing chamber through the second inlet.

10. An apparatus to fit within a computer system chassis for directing a first air flow from a first air moving unit and a second air flow from a second air moving unit to cool a first and a second device located within the computer system chassis, comprising:
    an air moving unit chamber, defined by a ceiling wall, a bottom wall, a back wall, a first side wall, and a removable side, the air moving unit chamber houses the first and second air moving unit;
    a mixing chamber, connected to the air moving chamber and defined by the ceiling wall, the bottom wall, a second side wall, and the removable side, the mixing chamber receives and mixes the first air flow and the second air flow;
    a first outlet, on the back wall of the mixing chamber, that directs the mixed first and second air flows to the first device; and
    a second outlet, on the back wall of the mixing chamber, that directs the mixed first and second air flows to the second device.

11. The apparatus of claim 10, further comprising:
    a first air inlet, on the ceiling wall, that receives outside air; and
    a second air inlet, on the removable side, that receives the outside air.

12. The apparatus of claim 10, wherein the first and second devices located in the computer system chassis are located outside of the apparatus.

13. A computer system, comprising:
    a chassis;
    a bus;
    a first processor coupled to the bus;
    a second processor coupled to the bus;
    a cooling duct unit to fit within the chassis, thermally connected to the first processor and the second processor, including a first inlet that receives a first air flow from a first air moving unit, a second inlet that receives a second air flow from a second air moving unit, a mixing chamber, connected to the first inlet and the second inlet, that receives and mixes the first air flow and the second air flow, a first outlet that directs the mixed first and second air flows to the first processor located outside the mixing chamber, and a second outlet that directs the mixed first and second air flows to the second processor located outside mixing chamber.

14. The computer system of claim 13, further comprising an air moving unit chamber, coupled to the first inlet and the second inlet, that houses the first air moving unit and the second air moving unit.

15. The computer system of claim 13, further comprising a support element, connecting the first inlet and the second inlet, that supports the first moving unit and the second moving unit.

16. The computer system of claim 14, further comprising:
- a first air inlet, connected to the air moving unit chamber, that receives outside air; and
- a second air inlet, connected to the air moving unit chamber, that receives outside air.

17. The computer system of claim 13, further comprising:
- a first inlet trap-door, coupled to the first inlet, that swings into the mixing chamber allowing the first air flow from the first cooling unit to pass into the mixing chamber and preventing the second air flow from the second cooling unit from exiting the mixing chamber through the first inlet; and
- a second inlet trap-door, coupled to the second inlet, that swings into the mixing chamber allowing the second air flow from the second cooling unit to pass into the mixing chamber and preventing the first air flow from the first cooling unit from exiting the mixing chamber through the second inlet.

18. The computer system of claim 13, further comprising:
- a first air director, inside the mixing chamber, that directs the first air flow towards the second air flow; and
- a second air director, inside the mixing chamber, that directs the second air flow towards the first air flow.

19. A method for cooling a first and a second device located outside a mixing chamber and inside a computer system chassis, comprising:
- directing a first air flow from a first air moving unit into the mixing chamber;
- directing a second air flow from a second air moving unit into the mixing chamber; and
- directing the first and second air flow from the mixing chamber to the first device located outside the mixing chamber and inside the computer system chassis, and to the second device located outside the mixing chamber and inside the computer system chassis.

* * * * *